Feb. 18, 1936.
P. O. FARNHAM
Re. 19,857
CARRIER WAVE RECEIVER
Original Filed Dec. 21, 1931
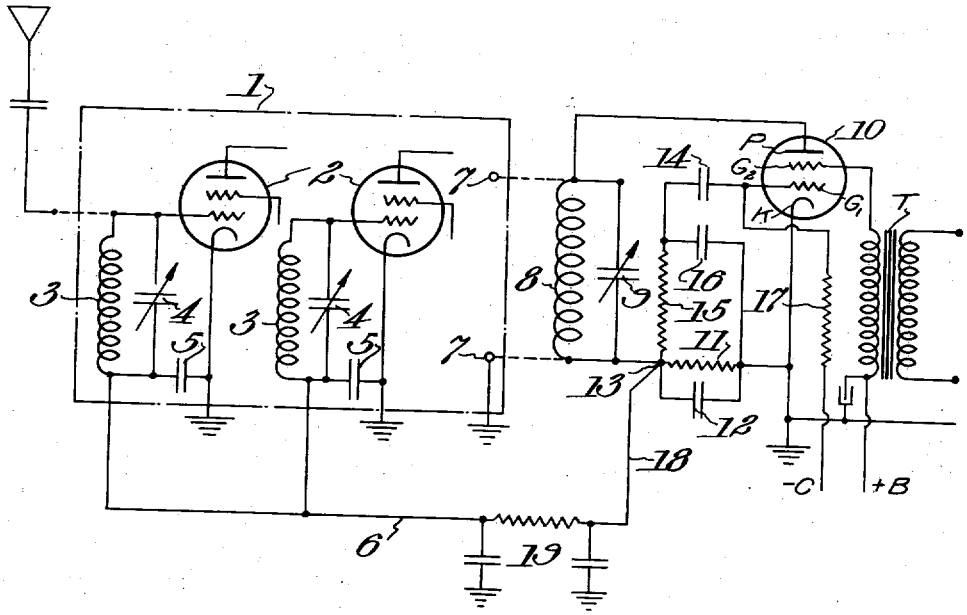
Inventor:
Paul O. Farnham,
By Byrnes Townsend & Potter,
Attorneys.

Reissued Feb. 18, 1936

Re. 19,857

UNITED STATES PATENT OFFICE 19,857

CARRIER WAVE RECEIVER

Paul O. Farnham, Boonton, N. J., assignor, by mesne assignments, to Radio Corporation of America, New York, N. Y., a corporation of Delaware Original No. 1,910,099, dated May 23, 1933, Serial No. 582,407, December 21, 1931. Application for reissue July 17, 1934, Serial No. 735,715

6 Claims. (Cl. 250—20)

This invention relates to carrier wave receivers and more particularly to receivers including a simple, efficient and inexpensive automatic volume control for rendering the rectified output substantially independent of the strength of the received signals.

An object of the invention is to provide an improved carrier wave receiver in which a single tube performs the function of a demodulator, a rectifier for supplying an automatic volume control voltage and an audio frequency amplifier. A further object is to provide a carrier wave receiver in which a multiple element tube constitutes a diode rectifier which delivers an audio frequency output to a local circuit and a rectified carrier voltage to a gain control circuit, and an audio frequency amplifier.

These and other objects of the invention will be apparent from the following specification when taken with the accompanying drawing in which the single view is a fragmentary circuit diagram of a receiver embodying the invention.

In the drawing, the reference numeral 1 identifies a carrier wave amplifier which includes one or more tubes 2 which have input circuits including inductances 3 tuned by condensers 4 which may be, and preferably are, similar sections of a gang condenser. The low potential terminals of the inductances 3 are grounded on their respective cathodes for carrier frequencies by condensers 5 and are connected to each other and to an automatic gain control voltage line 6 that leads to the novel detector stage that embodies the present invention.

The particular electrical design and the mechanical construction of the carrier wave amplifier do not form a part of the invention. The amplified signal voltage developed across the output terminals 7 of the carrier wave amplifier 1 is impressed upon the tuned input circuit, comprising inductance 8 and tuning condenser 9, of the multiple element tube 10. The tube 10 may be, as illustrated, a conventional screen grid tube having a cathode K, a control grid $G_1$, screen grid $G_2$ and a plate P, or it may include additional grid elements in accordance with known tube practice. As will be apparent from the following description, the tube does not function as a conventional screen grid tube but as a tube having a cathode, a control grid and two anodes.

The input circuit 8, 9 is not, however, connected between the cathode K and control grid $G_1$, but the high potential terminal of the input circuit is connected to the plate P and the lower potential terminal is connected to cathode K through the resistor 11 that is by-passed, for carrier frequencies, by a condenser 12. With this circuit arrangement, rectification of a modulated carrier frequency voltage impressed on the tube from the tuned input circuit 8, 9 takes place by the diode action between anode P and cathode K. The modulation component of the carrier voltage develops thereby an audio frequency component which is impressed on the control grid $G_1$ for amplification. The average carrier level develops a direct current component of voltage across resistor 11 which is fed back to furnish automatic grid bias for the preceding amplifier stages.

The audio frequency voltage developed across the resistance 11 is impressed upon the control grid $G_1$, by connecting the grid $G_1$ to the point 13, i. e., the junction of inductance 8 and resistance 11. This connection includes a condenser 14 to isolate the grid from the direct current component of the rectified carrier voltage, and a filter comprising a resistance 15 shunted to ground by condenser 16, which filter prevents any appreciable carrier frequency voltage from reaching the control grid $G_1$. A grid bias appropriate for audio frequency amplification is impressed on grid $G_1$ from a source, indicated as —C, through the bias resistor 17. The primary winding of an audio frequency transformer T is connected between the screen grid $G_2$ and a source of positive potential +B, and the element $G_2$ therefore acts as the anode of a triode amplifier having a cathode K and control grid $G_1$.

The direct current component of the rectified carrier voltage developed across resistor 11 by the diode action of plate P and cathode K is impressed upon the automatic gain control lead 6 by a connection 18 extending from point 13 to lead 6 through the alternating current filter network 19.

The following values are given as indicative of a design suitable for use in the reception of carrier wave signals in the frequency band of from 500 to 1500 kilocycles:

Resistance 11=200,000 ohms
Resistance 15=100,000 ohms
Capacity 12=500 micromicrofarads
Capacity 14=5,000 micromicrofarads
Capacity 16=100 micromicrofarads
Screen grid voltage, +B,=100 volts
Control grid bias, —C,=—5 volts Inductance 8 and tuning condenser 9 were substantially identical with the corresponding tuning elements 3, 4, respectively, of the carrier wave amplifier stages, and the transformer T was designed to give satisfactory audio fidelity characteristics.

As compared with the conventional use of a diode rectifier as a demodulator and a source of gain control voltage, the novel arrangement retains the advantage of the linear characteristics of the diode detector and possesses the further advantage that the rectifier signal is amplified at audio frequency, thus increasing the sensitivity of the receiver. Further advantages arise from the fact that the characteristics of the audio amplifier are not affected by value of the carrier input since the rectified carrier voltage is bypassed from control grid $G_1$ by the condenser 12. As the primary of the audio transformer T is in the output circuit of an amplifier, and not a detector, the transformer may be of comparatively inexpensive construction as it is not necessary to employ a high impedance primary.

In the usual plate circuit rectifying detectors, the tube impedance across which the audio load is connected has been several times greater than in the case of the same type tube employed as an amplifier. For fidelity over the audio frequency range, the audio load in the plate or output circuit should be constant over the audio range or, if not constant, should have values larger than the internal tube impedance across which it is connected. According to the present invention, the tube impedance across which the audio load is connected is relatively low since the direct current potentials on the control grid and screen grid circuits are appropriate for amplification, not detection. Good fidelity is therefore obtained when the audio frequency transformer has an impedance substantially lower than that of the transformers which, when located in a detector output circuit, would give equally good results.

I claim:

1. The combination with a carrier wave amplifier and a tube having cathode, control grid, screen grid and plate elements, of circuit connections for impressing between the cathode and plate elements the amplified carrier wave voltage developed by said amplifier, said circuit connections including a resistor across which rectified direct current and alternating current voltages are developed by the diode rectifier action of said cathode and plate elements, means for impressing the said alternating current voltage between the control grid and cathode elements, and means for returning to said amplifier a gain control voltage derived from and proportional to the rectified carrier voltage developed across said resistor.

2. The combination with a carrier wave amplifier and a tube having a cathode, first anode, control grid, and second anode; of circuit connections for impressing between the cathode and first anode elements the amplified carrier wave voltage developed by said amplifier, said circuit connections including a resistor across which rectified direct current and alternating current voltages are developed by the diode rectifier action of said cathode and first anode elements, means for impressing the said alternating current voltage between the control grid and cathode elements, and means for returning to said amplifier a gain control voltage derived from and proportional to the rectified carrier voltage developed across said resistor.

3. In a radio receiver, the combination with a radio amplifier; of a tube having a cathode, a rectifier anode, a control grid, and a positively polarized output anode; an input circuit for said tube upon which the radio output of said amplifier is impressed; said input circuit being connected between the cathode and the rectifier anode and including, in series, a radio frequency coupling circuit, and a resistor shunted by a radio bypass condenser; means grounding the tube cathode for audio and radio frequencies, a coupling capacity between control grid and the junction of said resistor and radio frequency coupling circuit; an audio frequency output circuit connected between the cathode and the positively polarized output electrode; means impressing between said control grid and cathode a direct current bias potential effective to secure amplification in the audio frequency output circuit of audio frequency variations impressed upon said control grid; and a direct current circuit for biasing said radio amplifier, said biasing circuit including the said resistor, whereby the gain of said radio amplifier is automatically varied as a function of the radio input to said receiver.

4. In a carrier wave receiver, the combination with a carrier wave amplifier, of a tube having a cathode, control grid, screen grid and plate elements; an input circuit for said tube and upon which the amplified carrier wave output of said amplifier is impressed, said input circuit being connected between the plate and cathode elements of said tube and including, in series, a tuned circuit and a resistor shunted by a carrier wave by-pass condenser, means grounding the tube cathode for audio and carrier frequencies, a capacity between control grid and the junction of said resistor and tuned circuit, an audio frequency output circuit connected between the screen grid and cathode, and means impressing between said control grid and cathode a direct current bias potential effective to secure amplification in the screen grid circuit of audio frequency variations impressed on said control grid, in combination with means including a direct current circuit connected across said resistor for automatically varying the gain of said amplifier as a function of the rectified carrier voltage developed across said resistor.

5. The combination with a radio amplifier and a tube having a cathode cooperating with a first anode to function as a rectifier and with a control grid and second anode to function as an amplifier, a diode network including circuit connections for impressing between the cathode and first anode the amplified radio voltage developed by said radio amplifier, said network including a resistor across which rectified direct current and audio frequency voltages are developed by the diode rectifier action of said cathode and first anode, means for impressing the said audio frequency voltage between the cathode and control grid, and means including said resistor for impressing upon said radio amplifier a direct current biasing voltage which varies with the radio input to said radio amplifier.

6. The combination with a high frequency signal wave transmission tube of an electron discharge tube provided with at least an electron emitter and an anode cooperating therewith to function as a wave rectifier, said tube additionally being provided with a cold electrode and a second anode to provide an amplifier, a diode network including circuit connections for impressing between the emitter and first anode the waves transmitted by said transmission tube, said network including a resistor across which rectified direct current and audio voltages are developed by the diode rectifier action, means for impressing the said audio voltage upon said cold electrode, and means including the resistor for impressing upon the transmission tube said direct current voltage as a gain control voltage which varies with the wave amplitude.

PAUL O. FARNHAM.